United States Patent [19]

Kupersmit

[11] 4,053,875
[45] Oct. 11, 1977

[54] STATIC CHARGE DETECTOR HAVING FAIL-SAFE VOLTAGE SURGE PROTECTION MEANS

[76] Inventor: Julius B. Kupersmit, 145-80 228th St., Springfield Gardens,, N.Y. 11413

[21] Appl. No.: 754,548

[22] Filed: Dec. 27, 1976

[51] Int. Cl.² .................. H02H 1/04; G08B 21/00
[52] U.S. Cl. .................. 340/248 P; 307/318; 323/8; 340/248 R; 361/117
[58] Field of Search .......... 340/248, 253, 176; 323/8, 22 Z; 361/91, 117, 118, 119; 325/149, 150, 362; 179/184, 186; 307/318

[56] References Cited

U.S. PATENT DOCUMENTS

| | | | |
|---|---|---|---|
| 2,789,254 | 4/1957 | Bodle et al. | 361/119 |
| 3,158,756 | 11/1964 | Brunner et al. | 323/8 UX |
| 3,181,033 | 4/1965 | Bakker | 179/184 X |
| 3,263,092 | 7/1966 | Knauss | 307/318 X |
| 3,284,787 | 11/1966 | Voigt et al. | 307/318 X |
| 3,519,881 | 7/1970 | Engel et al. | 323/22 Z UX |
| 3,558,830 | 1/1971 | Bender | 179/184 X |
| 3,723,812 | 3/1973 | Lynch | 323/8 X |

FOREIGN PATENT DOCUMENTS

| | | | |
|---|---|---|---|
| 2,019,937 | 4/1970 | Germany | 340/253 A |
| 977,913 | 3/1962 | United Kingdom | 323/8 |

Primary Examiner—John W. Caldwell, Sr.
Assistant Examiner—Daniel Myer
Attorney, Agent, or Firm—Charles E. Temko

[57] ABSTRACT

A static charge detector of a type disclosed in U.S. Pat. No. 3,452,346 having improved fail-safe protection means against voltage surges in the event of transformer failure.

1 Claim, 1 Drawing Figure

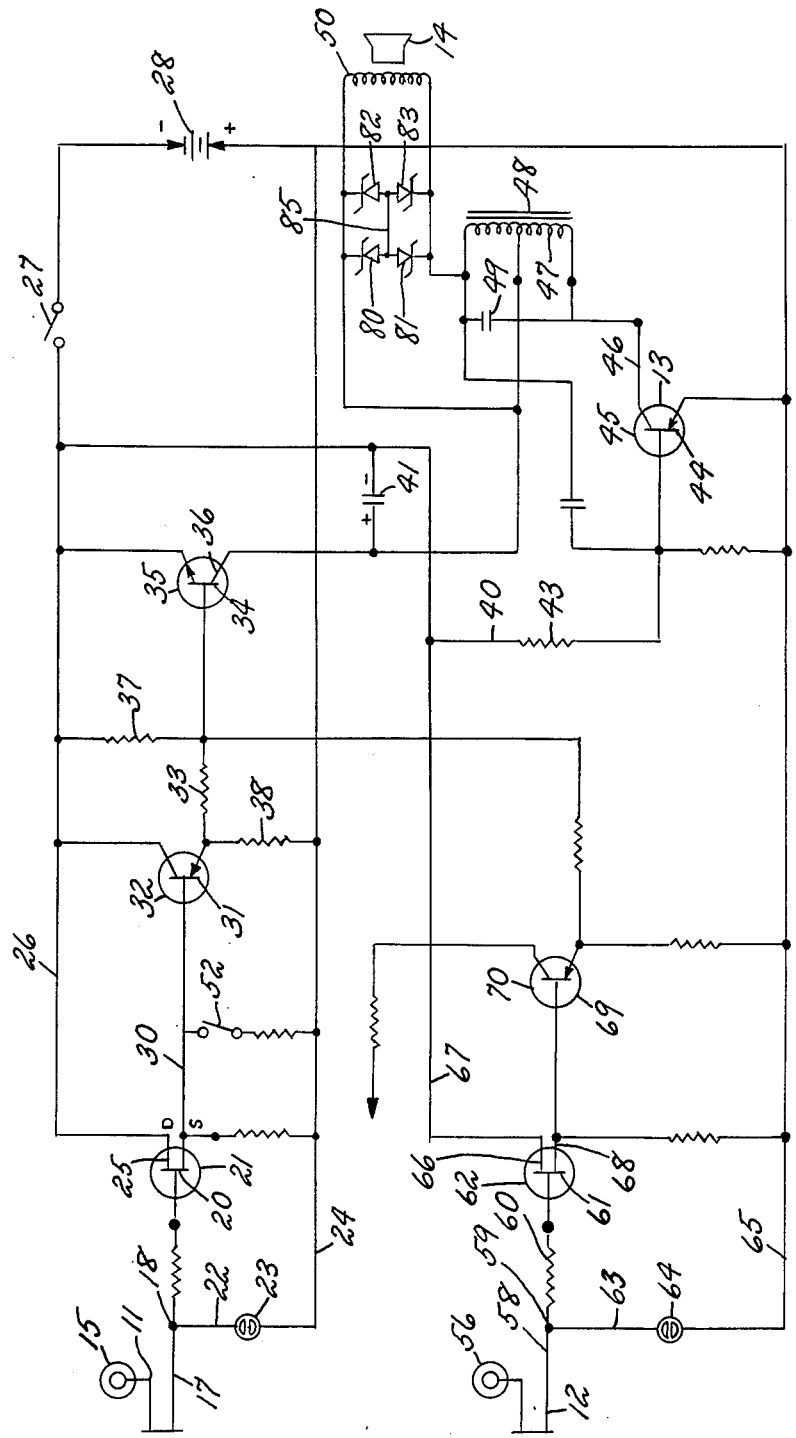

STATIC CHARGE DETECTOR HAVING FAIL-SAFE VOLTAGE SURGE PROTECTION MEANS

BACKGROUND OF THE INVENTION

In my prior U.S. Pat. No. 3,452,346 granted June 24, 1969, I have disclosed a static charge detector in the form of a battery-powered sensing device, including neon tube means for grounding a signal in excess of a predetermined voltage, a gating transistor receiving a signal of voltage between predetermined limits below said predetermined voltage, and emitter follow connected to the emitter of the gating transistor, a switching transistor controlled by the emitter follower, and an oscillating transistor controlled by the switching transistor. Such devices may be conveniently packaged, and are useful as an alarm device to indicate the presence of static electricity upon objects in areas where anesthetics and other explosive gaseous media are employed. While such construction has contributed substantially to the prevention of accidents in medical operating rooms and comparable areas, the design of the disclosed devices is such that should the one transformer included in the circuitry fail, the collapse of the field created by the transformer could permit a sudden surge of voltage of a value sufficient to cause an explosion. To prevent this occurrence, I incorporated in one of the disclosed embodiments a pair of Zener diodes employed as a voltage limiting device. These are placed back-to-back across the output coil powering the transducer. The presence of the diode circuit limits such possible surge to approximately 10 volts, well below that normally required to cause an explosion where the device is operated in a hazardous atmosphere. Unfortunately, the Zener diodes themselves may also be the subject of failure, in advance of transformer failure, so that should the transformer subsequently fail, the device is completely unprotected against a subsequent voltage surge, and possible explosion. While the possibility of such disaster is not of a large order of magnitude, the consequences require that adequate protection be afforded.

SUMMARY OF THE INVENTION

Briefly stated, the invention contemplates the provision of a static charge detector of the class described, in which the above mentioned Zener diodes are supplemented by an additional pair of protective devices connected in parallel, with an additional interconnection of the backs of the diodes. With such interconnection, should as many as one diode in each pair fail, full protection is still available.

BRIEF DESCRIPTION OF THE DRAWING

In the drawing, FIG. 1 is a schematic electrical wiring diagram of an embodiment of the invention.

DETAILED DESCRIPTION OF THE DISCLOSED EMBODIMENT

In accordance with the invention, the device, generally indicated by reference character 10 includes a positive charge detection element 11, a negative charge detection element 12, oscillating means 13, and transducing means 14.

The positive charge detecting element 11 includes an input jack 15 which is connected to a static charge probe of well known type, which includes a copper ball on the end thereof (not shown) upon which a charge may be induced when the same is placed in a position proximate to a charged article. Under normal operating conditions, this distance may be as great as 6 to 8 feet. The charge is transmitted along a conductor 17 to a junction point 18. To prevent the circuit from becoming damaged by an excessive charge, a 1,000 ohm resistor is connected between the junction point 18 and the base 20 a field effect NPN transistor 21. Another conductor 22 leads from the junction point 18 through a neon lamp 23 which becomes conductive when the induced potential exceeds approximately 65 volts, thus providing a path through the conductor 24 to ground. The field effect transistor 21 includes a collector 25 connected to a conductor 26 leading through a switch 27 to a self-contained battery 28, which may be of mercury type, having a potential of eight volts. The switch 21 is preferably of a completely enclosed type, so that no arcing will occur during operation of the same. The emitter 29 is connected through a conductor 30 to the base 31 of a second transistor 32. When conductive current flows through resistor 33 to the base 34 of an NPN transistor 35, the same operates as a switch, permitting current to flow directly from the battery 28 and through the emitter 36. Transistor 35 is connected to the ocillator 45 through conductor 40, capacitor 41, and resistor 43 to the base 44, and the output of the oscillator 45 is through a conductor 46 to the winding 47 of the transformer 48.

When no potential is induced onto the receptor transistor 21, the same operates as a source follower and draws a small idling current of about 1/5 milliampere. This current develops approximately eight volts at the bases of the emitter follower transistors 32 and 35. Under this condition, the base of the transistor 35, which operates as a solid state switch, is held at a low voltage with respect to its emitter, thus being effectively in the "off" position.

When a positive voltage is induced on the receptor connected to transistor 21, the field effect transistor is biased so that the drain source current is reduced to a low value. This is reflected as a lower voltage across resistor 37 and resistor 38. As a result, the voltage at the base of transistor 35 rises, providing a forward bias which drives transistor 35 to saturation in the "on" condition. When this occurs, the full battery voltage (less the saturation voltage of transistor 35) is applied to the audio oscillator transistor 45. Oscillation occurs at an audio frequency determined primarily by the resonance between the inductance of auto transformer 48 and capacitor 49. This frequency is used to power a transducer 50.

When the charge is removed from the receptor, the voltage across the oscillator decreases to the point where the oscillation dies out.

The power switch 27 is preferably of a sealed reed type, and is assembled with a small permanent magnet (not shown) which causes the contact to close, thus applying power to the device without unshielded arcing. When the device is not in use, it is inserted into a base which contains a larger permanent magnet of such position and polarity as to nullify the effect of the smaller internal magnet and cause the reed switch to open, thus turning the device off.

Switch 52 is a position-sensitive sealed mercury type, connected so that when the device is oriented more than 90° from upright position, the contacts close, causing the resistor 53 to be placed in parallel with resistor 37, causing the voltage at the base of transistor 32 to be reduced. This, in turn, increases the base-to-emitter voltage of transistor 35 and turns it to the "on" state. If the battery is in proper operating condition, the audio tone from the transistor 50 will be heard.

The negative charge detector element 12 is generally similar to the positive charge detector 11, and includes a jack 56 for the connection of an appropriate electrode. The charge, when received, is conducted through conductor 58 to a junction point 59. The resistor 60 corresponds to the resistor 19, and is connected to the base 61 of a field effect PNP transistor 62. A conductor 63 connects a neon lamp 64 corresponding to the lamp 23, in turn connected to a ground conductor 65. The transistor 62 includes a collector 66 connected through conductor 67 to the switch 27. The emitter 68 thereof connects to the base 69 of transistor 70, the output of which is connected to transistor 35, from which point operation and connections are identical to those of the positive charge detector element 11.

To prevent the occurrence of a sudden high voltage surge in the event of failure of the transformer 48 during operation, I have provided a first pair of Zener diodes 80 and 81 which are used as a voltage limiting device. They are placed back-to-back across the output coil 50. To protect against the possible failure of either of the diodes 80 and 81, I connect a second pair of diodes 82 and 83 in similar manner, and interconnect the backs of the diodes together by a conductor 85. I thus provide an operative equivalent to the diodes 80 and 81 should diodes 80 and 83 fail, or should diodes 81 and 82 fail, in each case, there being an operative circuit across the coil of the transducer. It will be readily understood that the likelihood of failure of all of the transformer 48, and three of the four diodes 80–83, in combination is so remote as to enable the device to be entirely safe for all applications.

I wish it to be understood that I do not consider the invention limited to the precise details of structure shown and set forth in this specification, for obvious modifications will occur to those skilled in the art to which the invention pertains.

I claim:

1. In a static charge detector including receptor means for detecting a signal, neon tube means for grounding a signal in excess of a predetermined voltage, a gating field effect transistor receiving a signal of voltage between predetermined limits below said predetermined voltage, an emitter follower connected to the emitter of said field effect transistor, a switching transistor controlled by said emitter follower, an oscillating transistor controlled by said switching transistor, a transformer receiving the output of said oscillating transistor, and an audible transducer receiving the output of said transformer, the improvement comprising: improved means for preventing excessive voltage surges as a result of failure of said transformer during use, said means comprising first and second pairs of Zener diodes, each connected in parallel with the output of said transformer, said pairs of transistors being mutually interconnected to provide multiple paths, to enable the same to function upon the simultaneous failure of not more than two of said Zener diodes.

* * * * *